United States Patent
Yoon et al.

(10) Patent No.: US 7,947,909 B2
(45) Date of Patent: May 24, 2011

(54) SUBSTRATE PANEL

(75) Inventors: Hee-Soo Yoon, Suwon-si (KR);
Chang-Hwan Choi, Seongnam-si (KR);
Soo-Heung Lee, Daejeon (KR);
Jong-Soo Yoo, Cheongju-si (KR);
Dal-Hyun Yoo, Hwaseong-si (KR);
Ji-Chul An, Goyang-si (KR);
Jeong-Hoon Park, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 486 days.

(21) Appl. No.: 12/213,793

(22) Filed: Jun. 24, 2008

(65) Prior Publication Data

US 2009/0139747 A1    Jun. 4, 2009

(30) Foreign Application Priority Data

Nov. 30, 2007    (KR) .................. 10-2007-0123934

(51) Int. Cl.
*H05K 1/11* (2006.01)

(52) U.S. Cl. ........ 174/261; 174/255; 361/611; 361/637; 361/648

(58) Field of Classification Search .................. 361/601, 361/602, 611, 613, 622, 624, 627, 633, 634, 361/636, 637, 644, 648, 650, 651, 30, 31, 361/33, 126, 93.9, 107, 128, 79, 80, 81, 179, 361/170, 792–795, 803, 748; 174/250, 255, 174/260–266
See application file for complete search history.

(56) References Cited

U.S. PATENT DOCUMENTS

| | | | | |
|---|---|---|---|---|
| 5,523,921 A * | 6/1996 | Van Lydegraf | ............. | 361/818 |
| 5,629,839 A * | 5/1997 | Woychik | ............. | 361/803 |
| 5,973,914 A * | 10/1999 | Rose et al. | ............. | 361/627 |
| 6,782,615 B2 * | 8/2004 | Shibata et al. | ............. | 29/846 |
| 7,375,971 B2 * | 5/2008 | RaghuRam et al. | ............. | 361/736 |
| 7,511,945 B2 * | 3/2009 | Scott | ............. | 361/627 |
| 7,810,063 B1 * | 10/2010 | Sharma et al. | ............. | 716/139 |
| 2002/0184756 A1 * | 12/2002 | Lowack et al. | ............. | 29/846 |

* cited by examiner

*Primary Examiner* — Dameon E Levi
*Assistant Examiner* — Hoa C Nguyen

(57) ABSTRACT

A substrate panel is disclosed. The substrate panel may include a pair of clamp contacts, a plurality of bus lines located between the pair of clamp contacts, and a plurality of substrate units supplied with an electric current by way of the plurality of bus lines, where the bus lines closer to the proximal clamp contact are arranged with larger intervals.

2 Claims, 6 Drawing Sheets

SUBSTRATE PANEL

CROSS-REFERENCE TO RELATED APPLICATIONS

This application claims the benefit of Korean Patent Application No. 10-2007-0123934 filed with the Korean Intellectual Property Office on Nov. 30, 2007, the disclosure of which is incorporated herein by reference in its entirety.

BACKGROUND

1. Technical Field

The present invention relates to a substrate panel.

2. Description of the Related Art

In the manufacturing process for a printed circuit board, plating processes are of utmost importance. In proceeding with such plating processes, clamp contacts 111, 112 may be located at the edges of a substrate panel 11, as illustrated in FIG. 1, by which to supply an electric current to the substrate units 121. The clamp contacts 111, 112 are the points to which a clamp is coupled, and thus may be changed in accordance to the position where the clamp is coupled. The clamp contacts 111, 112 may not necessarily be externally marked. There may be multiple substrate units 121, and there may be smaller unit substrates coupled inside each substrate unit 121.

The amount of current supplied to each substrate unit 121 may vary according to its position, so that deviations occur in the degree of plating. This can be caused by installing bus lines 121-123 in constant intervals, without considering the flow of the electric current. The bus lines 121-123 serve as paths by which an electric current supplied at the clamp contacts 111, 112 may be supplied to the substrate units 121.

FIG. 2 is a diagram representing the distribution of an electric current supplied to the substrates when the bus lines are arranged in constant intervals between the clamp contacts, as practiced according to the related art. As in FIG. 2, it is seen that the electric current can be distributed unevenly over the substrates. This may occur because bus lines 122 located in positions far from the clamp contacts 111, 112 may provide a relatively lower supply of electric current.

SUMMARY

An aspect of the invention provides a substrate panel, in which the entire panel can be plated uniformly.

Another aspect of the invention provides a substrate panel that includes a pair of clamp contacts, a plurality of bus lines located between the pair of clamp contacts, and a plurality of substrate units supplied with an electric current by way of the plurality of bus lines, where the bus lines closer to the proximal clamp contact are arranged with larger intervals.

An insulation part can be formed between the clamp contacts and the bus lines.

Additional aspects and advantages of the present invention will be set forth in part in the description which follows, and in part will be obvious from the description, or may be learned by practice of the invention.

DETAILED DESCRIPTION

Figure 1:
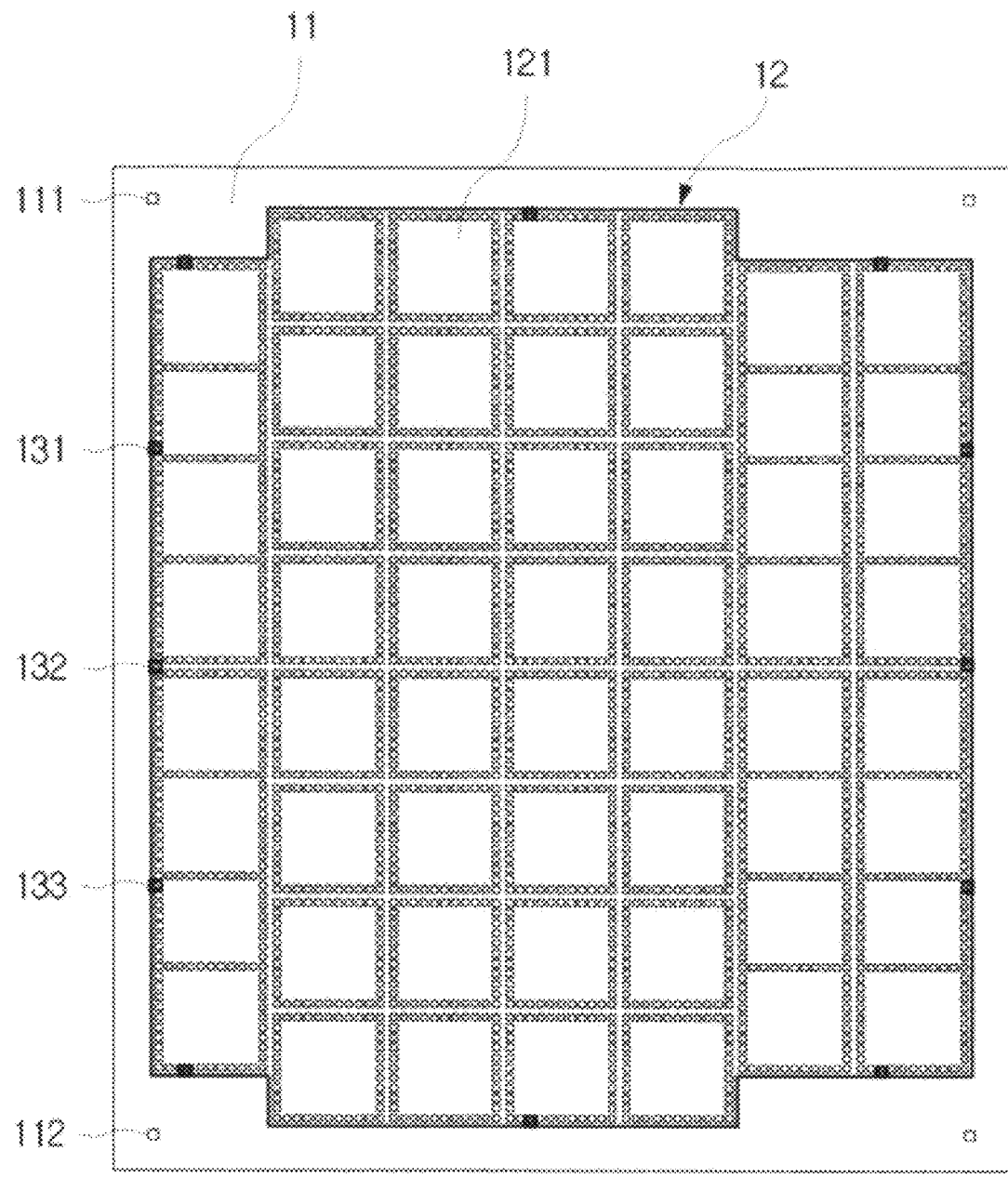
FIG. 1 is a plan view illustrating a substrate panel and substrates coupled together according to the related art.

The substrate panel according to certain embodiments of the invention will be described below in more detail with reference to the accompanying drawings. Those components that are the same or are in correspondence are rendered the same reference numeral regardless of the figure number, and redundant explanations are omitted.

Figure 3:
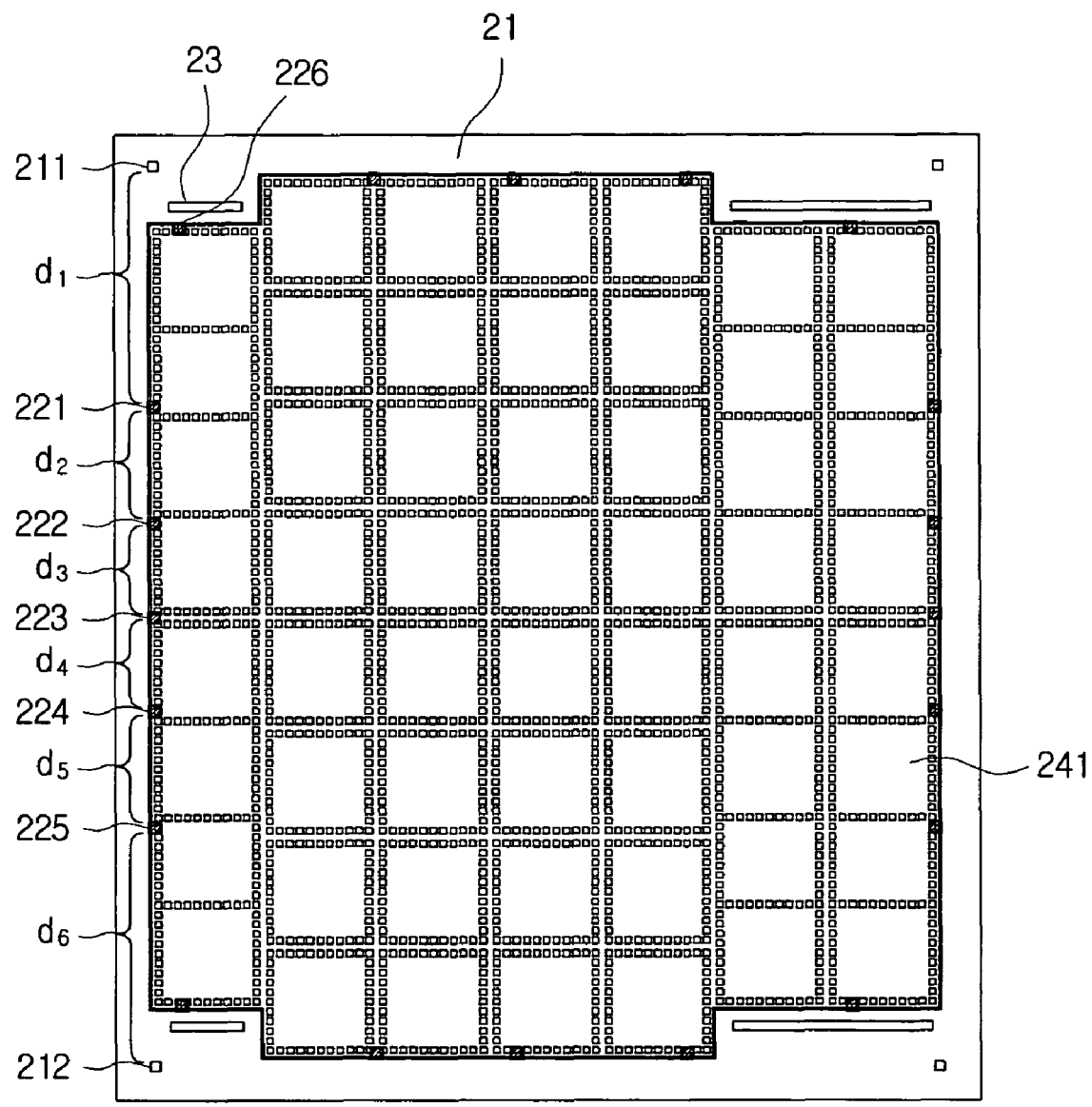
FIG. 3 is a plan view of illustrating a substrate panel and substrates coupled together according to an embodiment of the invention.
Figure 4:
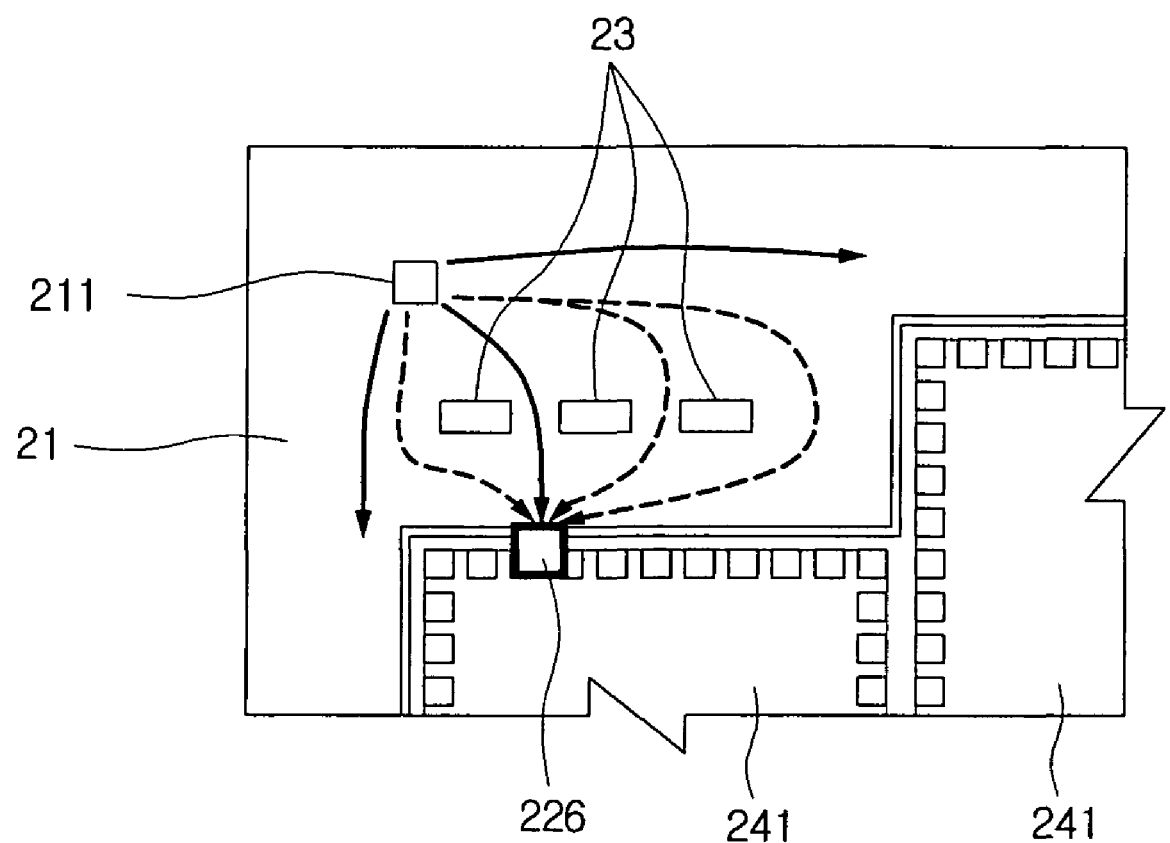
FIG. 4 is a magnified view illustrating a substrate panel and substrates coupled together according to an embodiment of the invention.

FIG. 3 is a plan view of illustrating a substrate panel and substrates coupled together according to an embodiment of the invention, and FIG. 4 is a magnified view illustrating a substrate panel and substrates coupled together according to an embodiment of the invention. In FIGS. 3 and 4, there are illustrated a substrate panel 21, a first clamp contact 211, a second clamp contact 212, a first bus line 221, a second bus line 222, a third bus line 223, a fourth bus line 224, a fifth bus line 225, insulation parts 23, and substrate units 241.

As shown in FIG. 3, the substrate panel 21 may pass through a plating bath, with substrate units 241 coupled to the middle. The plating bath may contain a plating liquid, in which the metal to be plated exist in the form of ions. An outside clamp may be coupled to the first and second clamp contacts 211, 212 of the substrate panel 21 to supply an electric current. The electric current may be supplied through the first and second clamp contacts 211, 212 to each of the substrate units 241, where the supply paths are implemented by the first to fourth bus lines 221-224.

As illustrated in FIG. 1, in the related art, there are multiple clamp contacts, with the supply paths to the substrate, i.e. bus lines, positioned in constant intervals between the clamp contacts.

In this embodiment, however, there may be multiple bus lines 221-225 positioned between the pair of the first and second clamp contacts 211, 212, but with the intervals between the bus lines increasing for bus lines that are closer to the nearer clamp contact 211, 212.

In this particular embodiment, starting from the third bus line 223, the intervals between the bus lines increase, the closer the bus lines are to a proximal clamp contact 211, 212.

However, in other embodiments, the increase in intervals between bus lines closer to the proximal clamp contacts may be included only in certain portions. The disclosure in claim 1 of this application, describing that "the bus lines closer to the proximal clamp contact are arranged with larger intervals" encompasses those cases where this arrangement of bus lines is applied only in certain portions.

While this particular embodiment is described using an example that has a pair of first and second clamp contacts 211, 212, multiple clamp contacts can be formed over the entire substrate panel 21. This embodiment is described for the example including a pair first and second clamp contacts 211, 212 and the first to fifth bus lines 221-225 arranged between the pair of first and second clamp contacts 211, 212, to effectively convey the spirit of the invention. However, clamp contacts may be formed at each corner of a square substrate panel 21, as in the example illustrated in FIG. 3, and multiple bus lines may be formed in-between.

A description will be provided, as follows, on the flow of electric current according to the arrangement of the first to fifth bus lines 221-225 for this particular embodiment.

In general, the electric current supplied through the first clamp contact 211 may be supplied along the edge of the conductive substrate panel 21, to be supplied through the first to fifth bus lines 221-225 to the substrate units 241.

Figure 2:
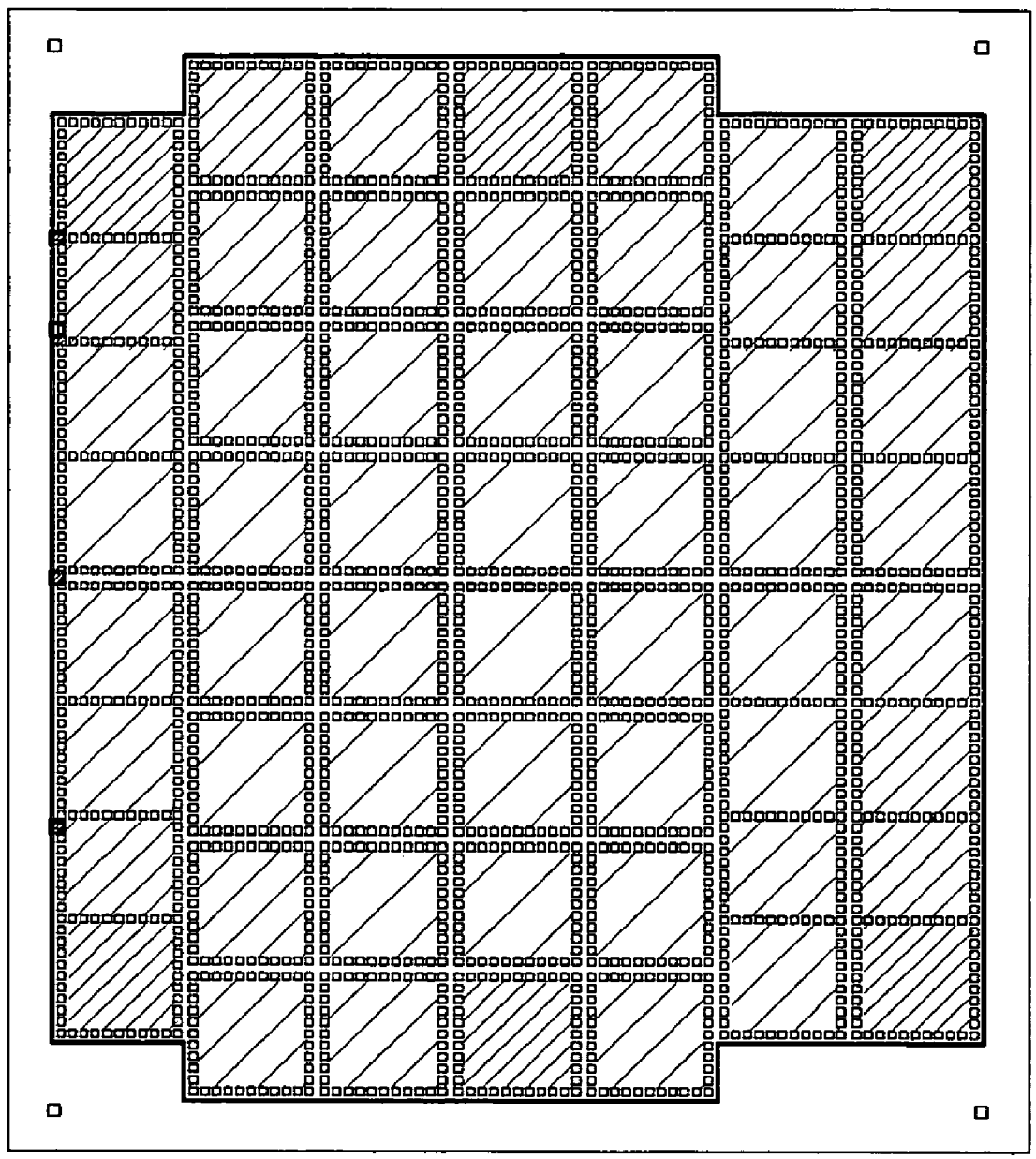
FIG. 2 is a diagram representing the distribution of an electric current in substrates according to the related art.

The amount of electric current supplied from the first clamp contact 211 to a bus line may decrease, the longer the distance is to the bus line. For example, the amount of electric current supplied to the first bus line 221, which is at a short distance from the first clamp contact 211, may be greater than the amount of electric current supplied to the second bus line 222. However, the amount of electric current supplied according to the distance from the clamp contact to a bus line is not in exact inverse proportion to the distance of the bus line. This can also be seen in simulation results, one of which is represented in FIG. 2, where an electric current is supplied to bus lines arranged in constant intervals. FIG. 2 shows that the distribution of electric current can become uneven if the bus lines are positioned in constant intervals.

The amount of electricity supplied according to the distance from the clamp contact to a bus line is estimated to be inversely proportional to about the square or cube of the distance. What is important is that it is not in exact inverse proportion to the distance between the clamp contact and the bus line. The amount of electric current supplied according to the distance from the clamp contact to the bus line may not easily be expressed as a function, since it is dependent on numerous variables, including the material and thickness, etc., of the substrate panel 21.

The bottom line is that the electric current may not be supplied well to bus lines that are far from the clamp contacts. Therefore, in this embodiment, the intervals between bus lines are small, the further the bus lines are away from the clamp contacts 211, 212.

This can be described in more detailed with reference to FIG. 3. The position of the third bus line 223, which is at the midpoint between the first clamp contact 211 and the second clamp contact 212, can be the most unfavorable position with regards supplying the electric current. In particular, if the supply of current is not exactly inversely proportional to the distance, but rather inversely proportional to the square or cube of the distance, it can be advantageous to have a bus line positioned in proximity to at least one of the clamp contacts. However, since the third bus line 223 is at an equally long distance from both the first clamp contact 211 and the second clamp contact 212, only a weak electric current may be obtained.

On the other hand, the first bus line 221 may be at a close distance from the first clamp contact 211. As such, a large amount of electric current may pass through the first bus line 221. Also, the fifth bus line 225 may be positioned close to the second clamp contact 212, and may therefore also deliver a large amount of electric current.

However, for the second to fourth bus lines 222-224, which may be positioned further from the clamp contacts 211, 212, relatively smaller amounts of electricity may be delivered.

Thus, those substrate units positioned near the first and fifth bus lines 221, 225, through which large amounts of current may pass, can be supplied with sufficient electric current, so that the plating process may be facilitated. However, for those substrate units receiving the electric current from the second to fourth bus lines 222-224, through which relatively less current may pass, the bus lines may be positioned with smaller intervals, so that the substrate units may be supplied with more of the electric current.

As a result, the intervals between bus lines may be increased more, the further the bus lines are from the third bus line 223 located at the midpoint of the first and second clamp contacts 211, 212, and the closer the bus lines are to the nearest clamp contact, as in the example illustrated in FIG. 3.

Looking at the arrangement from the third bus line 223 to the first clamp contact 211, the distance between the third bus line 223 and the second bus line 222 (d3) may be shorter than the distance between the second bus line 222 and the first bus line 221 (d2).

Likewise, looking at the arrangement from the third bus line 223 to the second clamp contact 212, the distance between the third bus line 223 and the fourth bus line 224 (d4) may be shorter than the distance between the fourth bus line 224 and the fifth bus line 225 (d5).

Figure 5:
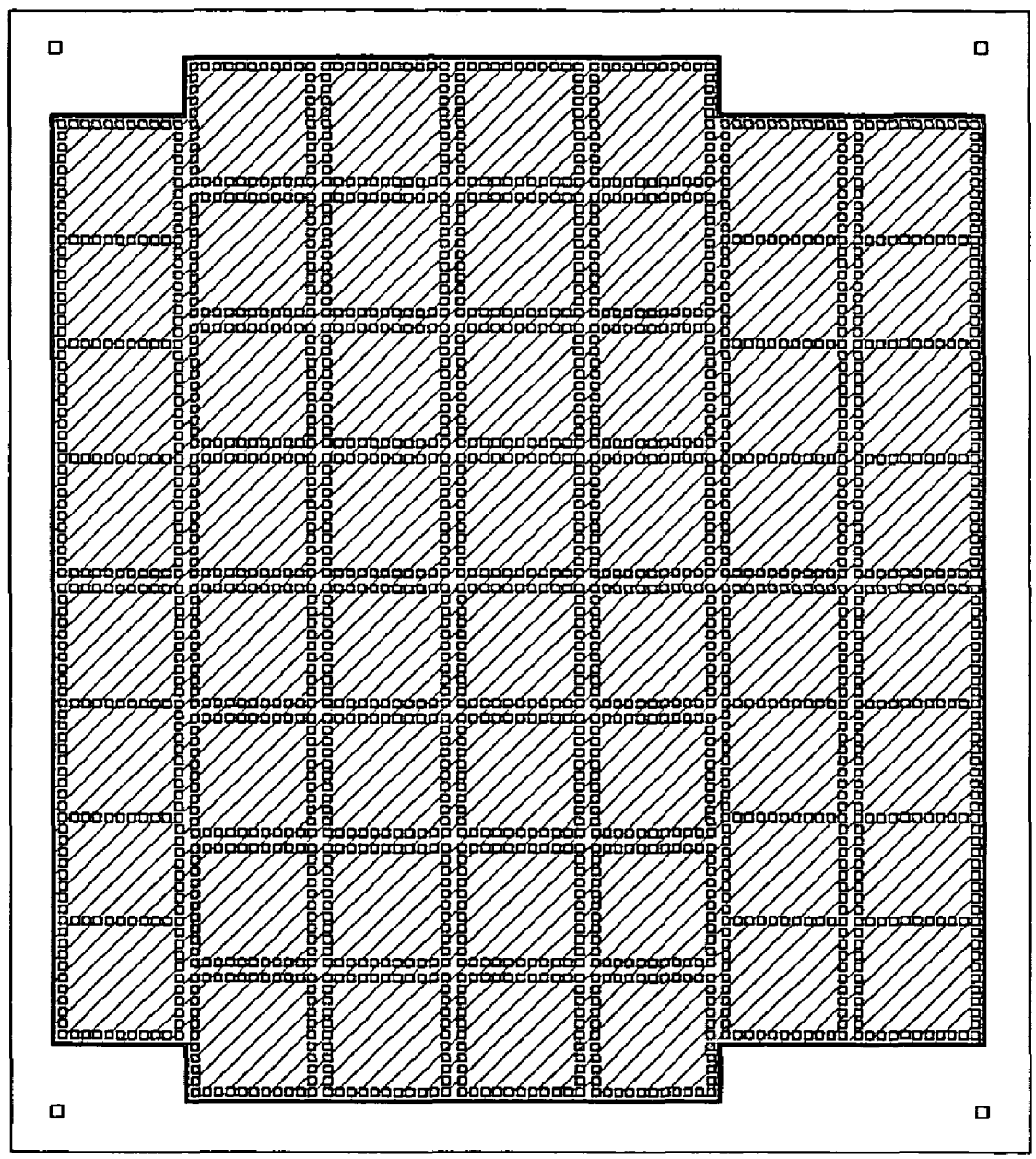
FIG. 5 and FIG. 6 are diagrams representing the distribution of electric currents in substrates according to an embodiment of the invention.

When an electric current is supplied to the substrate panel 21 structure illustrated in FIG. 3, the electric current may be supplied in a uniform distribution over the entire area of all of the substrate units 241, as shown in the distribution of electric current illustrated in FIG. 5.

As in the example shown in FIG. 4, insulation parts 23 may be formed in the substrate panel 21 between the first clamp contact 211 and a sixth bus line 226. These insulation parts 23 may obstruct the electric current directly flowing to the sixth bus line 226 and force the current to detour. As a result, the electric current may be distributed uniformly over the entire substrate panel 21.

Figure 6:
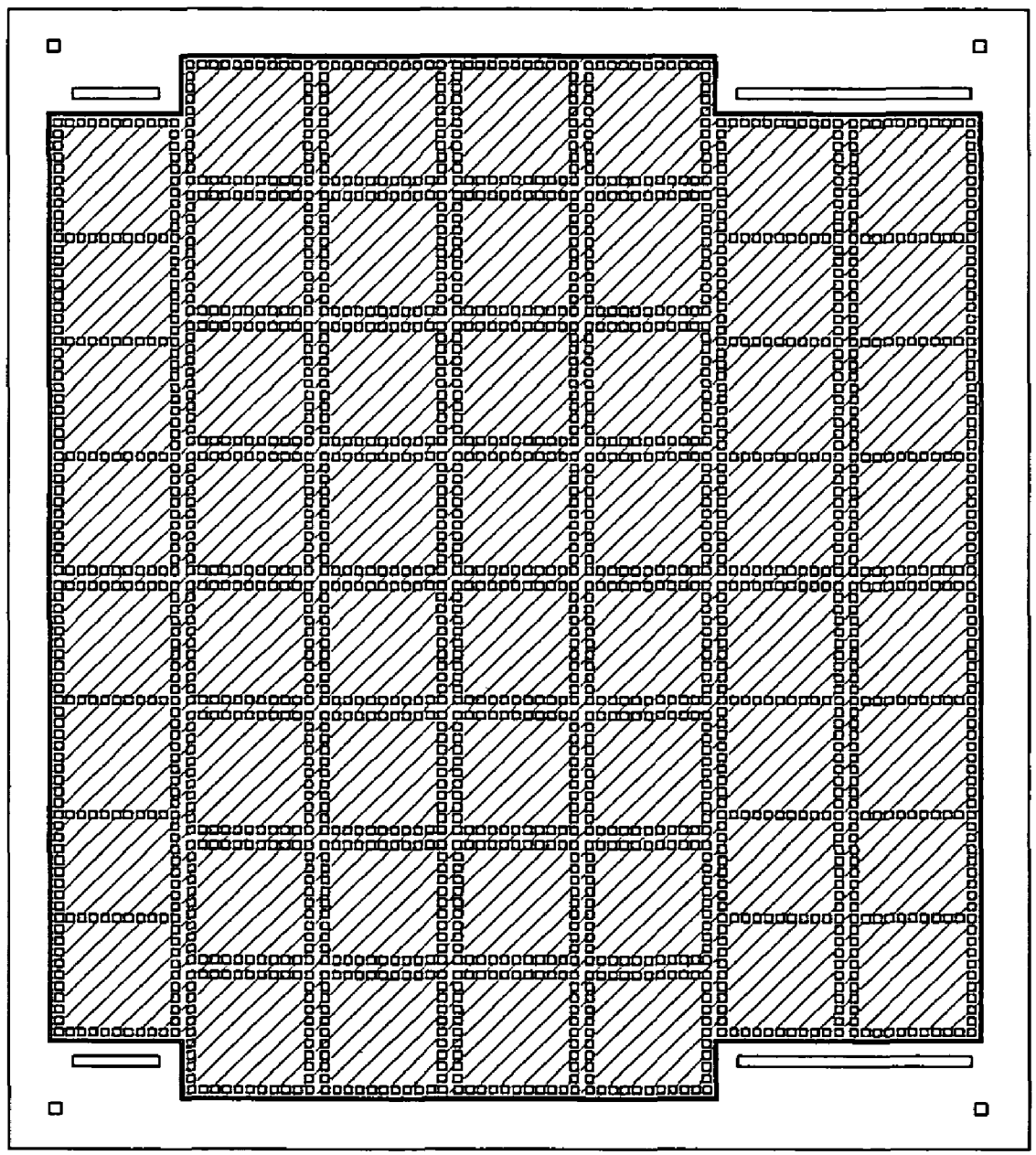

Substrate units were coupled onto a substrate panel 21 in which insulation parts 23 were formed, as described above, and the distribution of electric current was measured. The results obtained are similar to the diagram illustrated in FIG. 6, in which a uniform distribution is shown. The insulation parts 23 can be positioned between a clamp contact and a bus line positioned in proximity to the clamp contact.

Such insulation parts 23 can be such that do not allow plating over the corresponding positions, during the manufacture of the substrate panel 21.

According to certain aspects of the invention as set forth above, the bus lines can be arranged in a substrate panel in consideration of the distribution of electric current supplied to the substrate, so that the current may be supplied uniformly over the entire substrate, and so that all of the substrate units included in the substrate may be plated to a uniform thickness.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A substrate panel comprising:
    a pair of clamp contacts;
    a plurality of bus lines located between the pair of clamp contacts; and
    a plurality of substrate units supplied with an electric current by way of the plurality of bus lines,
    wherein the bus lines closer to the proximal clamp contact are arranged with larger intervals.

2. The substrate panel of claim 1, wherein an insulation part is formed between the clamp contacts and the bus lines.

* * * * *